United States Patent
Miura

(10) Patent No.: US 7,038,362 B2
(45) Date of Patent: May 2, 2006

(54) DISPLAY APPARATUS AND METHOD FOR DISPLAYING INFORMATION

(75) Inventor: Hirotsuna Miura, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 117 days.

(21) Appl. No.: 10/828,256

(22) Filed: Apr. 21, 2004

(65) Prior Publication Data

US 2005/0077815 A1    Apr. 14, 2005

(30) Foreign Application Priority Data

May 13, 2003   (JP)   .............................. 2003-134456

(51) Int. Cl.
   *H01J 1/62*   (2006.01)
   *H01J 5/16*   (2006.01)
   *H05B 33/04*  (2006.01)

(52) U.S. Cl. ...................... 313/112; 313/504; 313/505; 313/506

(58) Field of Classification Search ................ 313/112, 313/504, 505, 506
See application file for complete search history.

(56) References Cited

U.S. PATENT DOCUMENTS 6,933,672 B1 *  8/2005  Hosokawa .................. 313/504

FOREIGN PATENT DOCUMENTS

| JP | A 10-012377 | 1/1998 |
|----|-------------|--------|
| JP | A 2002-341375 | 11/2002 |

* cited by examiner

*Primary Examiner*—Mariceli Santiago
*Assistant Examiner*—Anthony Perry
(74) *Attorney, Agent, or Firm*—Oliff & Berridge, PLC

(57) ABSTRACT

The invention reduces the use of material for light-emitting elements in the production of a display apparatus. In a display apparatus, a plurality of light-emitting devices are arranged. Each light-emitting device is composed of a light-emitting unit and a driving circuit. The light-emitting unit includes a cathode, a transparent anode serving as a pixel electrode, and light-emitting elements interposed between the cathode and the anode. The driving circuit feeds a driving current to the anode. Further, an auxiliary electrode is disposed on at least one surface of the anode and is branched off from a feeding point of the driving circuit. The light-emitting elements are only disposed in regions adjacent to the auxiliary electrode, while light-transmitting members are disposed in the other regions distant from the auxiliary electrode.

15 Claims, 4 Drawing Sheets

_US 7,038,362 B2_

DISPLAY APPARATUS AND METHOD FOR DISPLAYING INFORMATION

BACKGROUND OF THE INVENTION

1. Field of Invention

The present invention relates to display apparatuses and methods for displaying information.

2. Description of Related Art

The related art includes an organic EL display apparatus usable as a next-generation display apparatus. In this organic EL display apparatus, a plurality of light-emitting devices, each including a light-emitting unit and a driving circuit, are two-dimensionally arranged on a glass substrate. Each light-emitting unit includes a transparent electrode (anode) serving as a pixel electrode, a metal cathode, and an organic EL member serving as a light-emitting element interposed therebetween. The driving unit feeds a driving current to the transparent electrode.

However, in an organic EL display apparatus with a large screen, a large amount of expensive organic EL material is required since the sizes of the pixel electrode, the light-emitting device, and the light-emitting element also become correspondingly large. Therefore, a large-screen organic EL display apparatus is more costly than a small-screen type due to its additional use of the organic EL material. Details of a related art organic EL display apparatus described above are disclosed, for example, in Japanese Unexamined Patent Application Publication No. 10-012377.

SUMMARY OF THE INVENTION

The present invention addresses the above and/or other circumstances, and reduces the use of the material for light-emitting elements.

In a display apparatus of the present invention, a plurality of light-emitting devices are arranged. Each light-emitting device is composed of a light-emitting unit and a driving circuit. The light-emitting unit includes a cathode, a transparent anode serving as a pixel electrode, and light-emitting elements interposed between the cathode and the anode. The driving circuit feeds a driving current to the anode. Further, an auxiliary electrode is disposed on at least one surface of the anode and is branched off from a feeding point of the driving circuit. The light-emitting elements are only disposed in regions adjacent to the auxiliary electrode, while light-transmitting members are disposed in other regions distant from the auxiliary electrode.

To implement a method for displaying information according to the present invention, a plurality of light-emitting devices are arranged. Each light-emitting device is composed of a light-emitting unit and a driving circuit. The light-emitting unit includes a cathode, a transparent anode serving as a pixel electrode, and light-emitting elements interposed between the cathode and the anode. The driving circuit feeds a driving current to the anode, thereby allowing the light-emitting elements to emit light to display information. Further, an auxiliary electrode is disposed on at least one surface of the anode and is branched off from a feeding point of the driving circuit. The light-emitting elements are only disposed in regions adjacent to the auxiliary electrode, while light-transmitting members are disposed in other regions distant from the auxiliary electrode.

According to the structure described above, the light-emitting elements are only provided in regions adjacent to the auxiliary electrode, which is branched off from the feeding point, instead of being provided in the entire region between the cathode and anode like in the related art. Since the light-transmitting members are provided in the other regions, the use of the material for the light-emitting elements is reduced, while sacrificing a small degree of light intensity of the light-emitting device.

The cathode is normally made of metal and has a high light reflectivity. Light from the light-emitting elements propagating towards the cathode is thus reflected off the cathode, and passes through the light-transmitting members and the anode to be provided for display. As described, the light intensity of the light-emitting device decreases as a result of a reduced use of the light-emitting elements. However, since the light-transmitting members, rather than light-blocking members, are provided at the regions where no light-emitting elements are disposed, the reduction in the light intensity is limited to a small degree.

Moreover, in this basic structure of the present invention, when wavelength-selective light-transmitting members are used as light-transmitting members, only the light originally designed to be emitted from the light-emitting elements is selectively transmitted. The color purity of the display light is thus enhanced, thereby enhancing the display quality.

That is, since the emission spectrum of a light-emitting element normally is not a single-wavelength line spectrum but has a certain range of wavelengths, the color purity is not necessarily high. However, since the color purity of the light transmitted through the wavelength-selective light-transmitting members is higher than that of the light emitted from the light-emitting elements, the overall color purity of the light provided for display is enhanced by adopting the wavelength-selective light-transmitting members.

Further, in the case where light-emitting elements composed of an organic EL material are applied in displaying information, the use of the expensive organic EL material is also reduced.

Moreover, when a plurality of the light-emitting devices are two-dimensionally arranged to display information, the use of the material for the light-emitting elements in each light-emitting device is also reduced.

Furthermore, the present invention is also applied to displaying information in color. The structure required to implement color display generally adds complexity to the production process (for example, when photolithography is used). However, when an inkjet process is used according to the present invention, color filters and light-emitting elements are easily formed by respective nozzles.

DETAILED DESCRIPTION OF PREFERRED EMBODIMENTS

Exemplary embodiments of the present invention are described below with reference to the drawings. In the exemplary embodiment below, the present invention is applied to an organic EL display apparatus where organic EL members are used as light-emitting elements.

Figure 1:
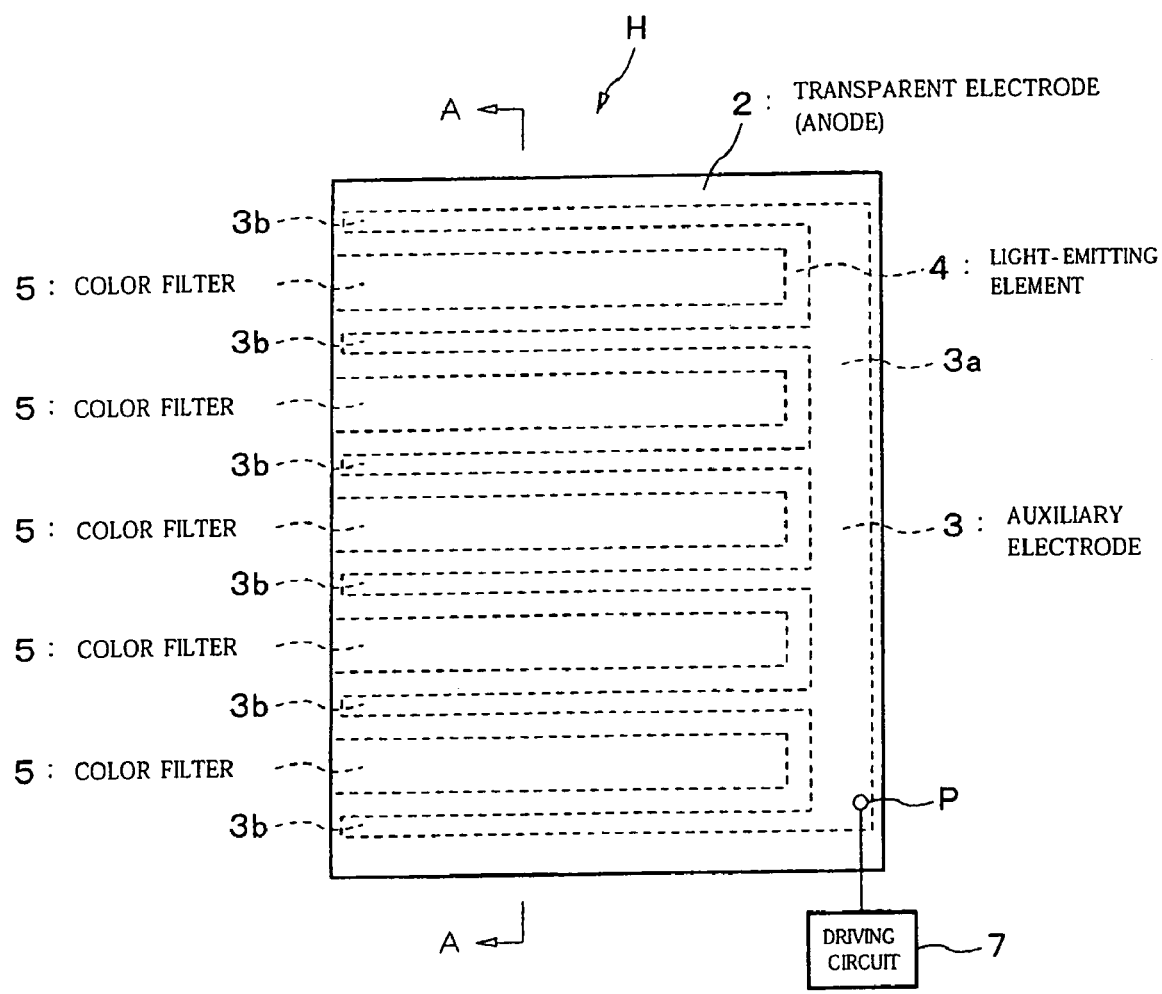
FIG. 1 is a front view showing a significant part (light-emitting device) of the organic EL display apparatus according to an exemplary embodiment of the present invention.
Figure 2:
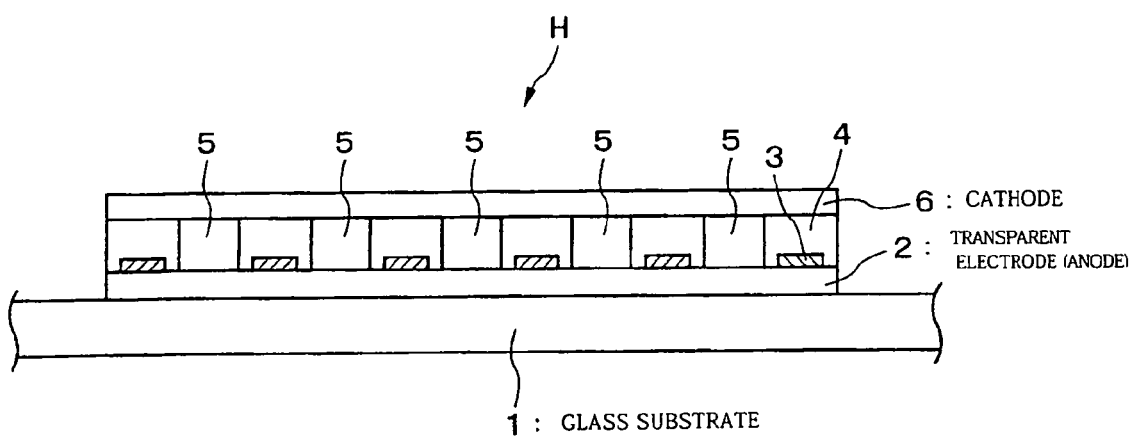
FIG. 2 is a cross-sectional view taken along plane A—A of the front view in FIG. 1.

FIG. 1 is a front view showing a significant part (light-emitting device) of the organic EL display apparatus of the exemplary embodiment. FIG. 2 is a cross-sectional view taken along plane A—A of the front view in FIG. 1. In these drawings, H denotes a light-emitting unit, reference numeral 1 denotes a glass substrate, reference numeral 2 denotes a transparent electrode (anode), reference numeral 3 denotes an auxiliary electrode, reference numeral 4 denotes a light-emitting element, reference numeral 5 denotes a color filter (wavelength-selective light-transmitting member), reference numeral 6 denotes a cathode, and reference numeral 7 denotes a driving circuit.

In the organic EL display apparatus, a plurality of light-emitting devices, each being made up of the described components, are arranged horizontally (in the direction of horizontal scanning) and vertically (in the direction of vertical scanning), that is, two-dimensionally arranged on the glass substrate 1 systematically. To display images in color, three adjacent light-emitting devices constitute one color pixel. Different types of the light-emitting elements 4 are assigned to the three respective light-emitting devices such that each device emits one of the primary colors of light.

As shown in the drawings, the transparent electrode 2 (indium tin oxide, ITO), the auxiliary electrode 3, the light-emitting elements 4, the color filters 5, and the cathode 6 are deposited on the glass substrate 1 to form the light-emitting unit H. A driving current fed from the driving circuit 7 to the transparent electrode 2 and the auxiliary electrodes 3 allows the light-emitting unit H to emit light.

Referring to FIG. 1, in the light-emitting unit H, the substantially rectangular transparent electrode 2 is disposed on the glass substrate 1, and the comb-shaped auxiliary electrode 3 is disposed on the transparent electrode 2. The light-emitting elements 4 composed of an organic EL material are only disposed in regions adjacent to the auxiliary electrode 3, while the color filters 5 are disposed in other regions where no light-emitting elements 4 are disposed. The cathode 6 is then disposed over the light-emitting elements 4 and the color filters 5.

As shown in FIG. 1, the auxiliary electrode 3 is disposed on a surface of the transparent electrode 2 adjacent to a light-emitting layer. The auxiliary electrode 3 is made of a metal with a lower resistivity than that of the transparent electrode 2. The auxiliary electrode 3 includes a common feeder 3a and branched feeders 3b. The common feeder 3a has a feeding point P of the driving circuit 7 and is linearly disposed along one side of the transparent electrode 2. The branched feeders 3b linearly extend, at certain intervals, in the direction orthogonal to the common feeder 3a.

The auxiliary electrode 3 on the light-emitting-layer side of the transparent electrode 2 is branched away from the feeding point P and supplements the conductivity of the transparent electrode 2. Light emerging from the light-emitting elements 4 passes through the transparent electrode 2 and the glass substrate 1 and is emitted outwardly for allowing information such as images to be displayed.

The shape of the auxiliary electrode 3 illustrated in FIG. 1 is determined as a result of balancing the following three conditions, that is, sufficiently transmitting light emitted from the light-emitting elements 4, reducing or minimizing the distance from the feeding point P, and extending over a wide range of the transparent electrode 2. The driving circuit 7 feeds a driving current via the feeding point P to the auxiliary electrode 3 and the transparent electrode 2.

The color filters 5 are composed of a wavelength-selective light-transmitting material that transmits, for example, only red light when the light-emitting device is originally designed to emit red light in the three primary colors of light. As described above, the color filters 5 are only disposed in the regions where no light-emitting elements 4 are disposed, that is, between the branched feeders 3b.

Figure 3:
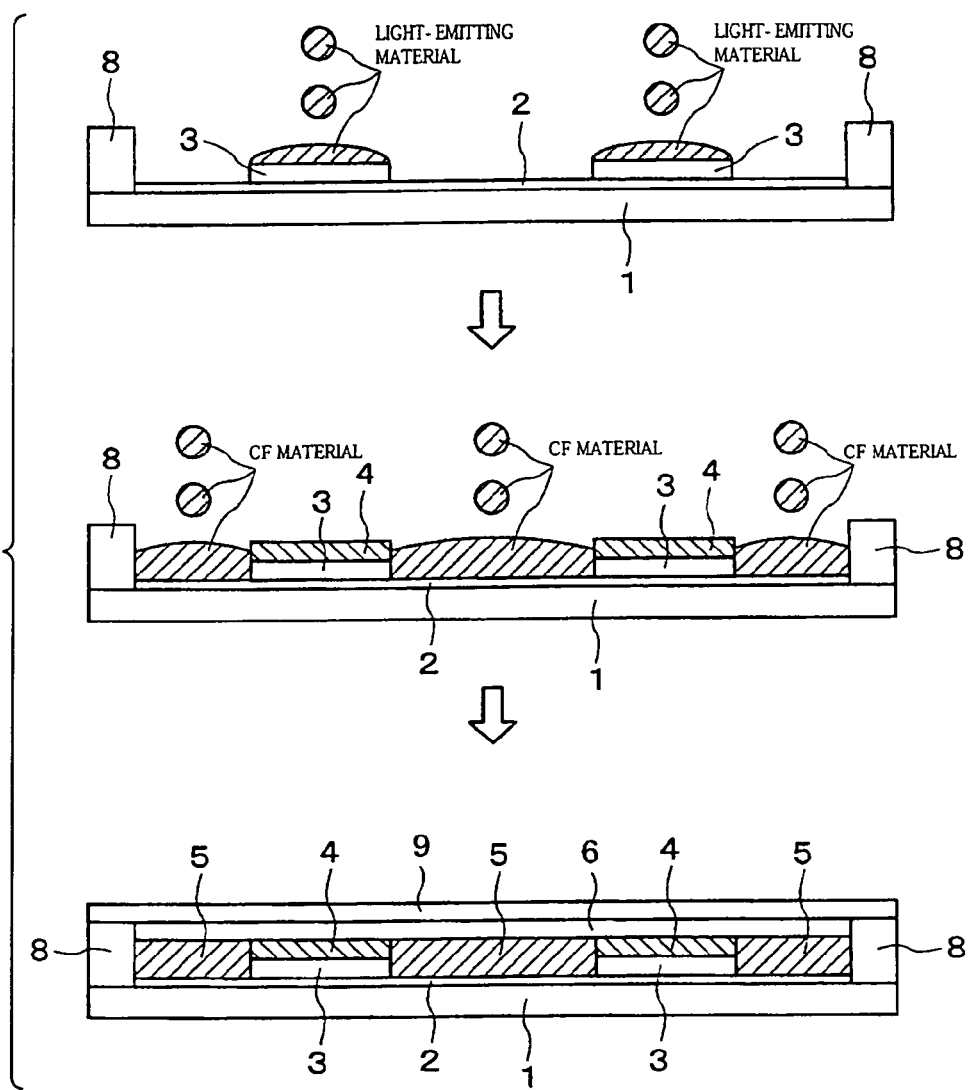
FIG. 3 is a schematic that shows a production process of the organic EL display apparatus according to the exemplary embodiment of the present invention.

Referring to FIG. 3, a method for producing the organic EL display apparatus is described in detail. The following describes a method for only producing a significant part of the organic EL display apparatus, since Japanese Patent Application No. 2002-341375 details the overall production process.

[First Step: Forming Transparent Electrode and Banks, etc.]

As shown in the upper drawing in FIG. 3, banks 8 are formed by, for example, photolithography on the glass substrate 1. The banks 8 define individual pixel regions. While FIG. 3 illustrates the banks 8 defining one pixel, the plurality of banks 8 corresponding to the respective pixels are actually provided on the glass substrate 1 at a predetermined interval. Subsequently, droplets of material to form the transparent electrode 2 (ITO) are applied to the pixel region surrounded by the banks 8 on the surface of the glass substrate 1 using, for example, an inkjet (IJ) process. The droplets are then dried to form the transparent electrode 2 in the pixel region.

[Second Step: Forming Auxiliary Electrode]

Next, liquid-repellent treatment is applied to the surface of the transparent electrode 2 except the regions where the auxiliary electrode 3 is to be provided. Further, droplets of material to form the auxiliary electrode 3 are applied to the transparent electrode 2 by an IJ process. The droplets are then dried to form the auxiliary electrode 3 on predetermined regions of the transparent electrode 2.

[Third Step: Forming EL layer (Light-Emitting Element 4)]

Subsequently, droplets including light-emitting material (EL material) are applied to the auxiliary electrode 3 by an IJ process and are dried to form the light-emitting elements 4 only on the auxiliary electrode 3. To prevent the applied EL material from spreading over the transparent electrode 2, an enhanced or optimum amount of the EL material needs to be applied to the auxiliary electrode 3. As shown in the upper drawing in FIG. 3, when the enhanced or optimum amount of the EL material is applied to the auxiliary electrode 3, surface tension created by, for example, a height difference between the transparent electrode 2 and the auxiliary electrode 3 retains the EL material only on the auxiliary electrode 3.

[Fourth Step: Forming Color Filter (CF) Layer (Color Filter 5)]

As shown in the middle drawing in FIG. 3, after the formation of the light-emitting elements 4 on only the auxiliary electrode 3, droplets of material (CF material) to form the color filter 5 are applied to the pixel region by using an IJ process, except the regions where the auxiliary electrode 3 (light-emitting elements 4) are formed. The droplets are then dried to form the color filters 5 in the pixel region except the regions where the auxiliary electrode 3 (light-emitting elements 4) are formed.

The droplets of the color filter 5 material are prevented from adhering to the light-emitting elements 4 by controlling the quantity of the CF material to be applied. Such adhesion decreases the efficiency of feeding from the cathode 6, and thus the efficiency of light emission. In a display apparatus for a large screen panel, the color filters 5 are accurately formed in the pixel region, except the regions where the auxiliary electrode 3 (light-emitting elements 4) are formed since each pixel region is as large as about 1 mm square.

In the third and fourth steps of the production method, the interface shapes between the light-emitting elements 4 and the color filters 5 are not accurately defined. Although this presents no particular problem, flatness of the light-emitting elements 4 is important. Therefore, the amount of the droplets to be applied should be adjusted so that the surfaces of the light-emitting elements 4 can be made as flat as possible.

[Fifth Step: Forming Cathode and Sealing]

After the formation of the light-emitting elements 4 and the color filters 5, a liquid material to form the cathode 6 is applied to the top of both and then dried. As shown in the lower drawing in FIG. 3, the cathode 6 is thus formed and sealed with sealant 9 thereon.

Figure 4:
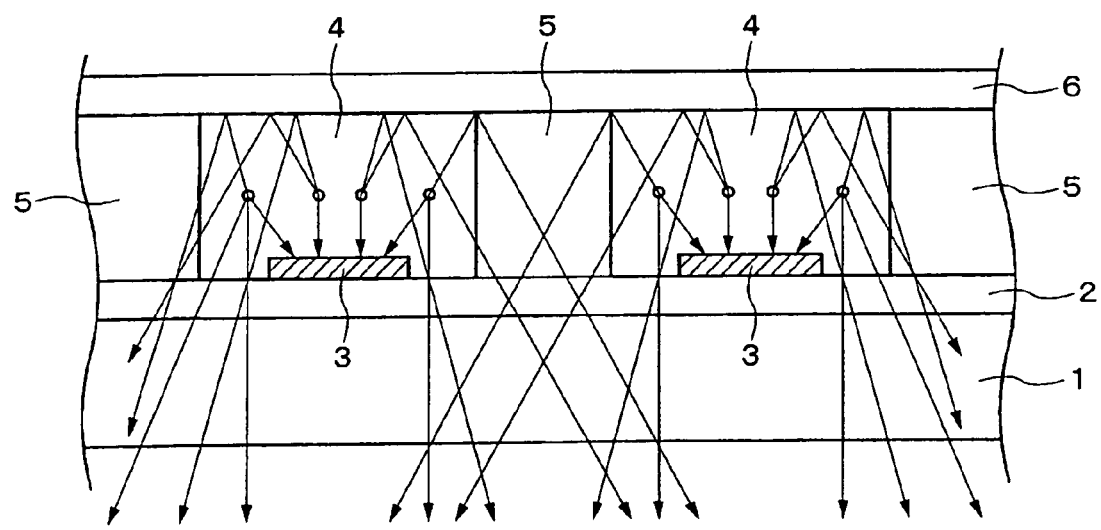
FIG. 4 is a schematic that shows the optical behavior in the exemplary embodiment according to the present invention.

Referring also to FIG. 4, the operation of the organic EL display apparatus (in particular, the light-emitting device) is described in detail.

In the described light-emitting device, holes are injected from the driving circuit 7 through the transparent electrode 2 and the auxiliary electrode 3 to the light-emitting elements 4, while electrons are injected from the cathode 6 to the light-emitting elements 4. Light is thus emitted from the light-emitting device by recombination of the holes and the electrons in the light-emitting elements 4. In the light-emitting device of the organic EL display apparatus, as described above, the light-emitting elements 4 are only provided in the regions adjacent to the auxiliary electrode 3 instead of being provided over the entire region between the transparent electrode 2 and the cathode 6. The color filters 5 are provided in the regions where no light-emitting elements 4 are disposed.

In the related art light-emitting device, the light-emitting element is disposed over the entire region interposed between the transparent electrode 2 and the cathode 6, and the entire region emits light according to the light emission of the light-emitting element. Although the entire region does not emit light in the light-emitting device of the present exemplary embodiment, the use of the material for the light-emitting elements 4 is reduced by an amount corresponding to the color filters 5.

FIG. 4 shows the optical behavior in the light-emitting device. As shown, light beams emerging from the light-emitting elements 4 towards the transparent electrode 2 pass through the transparent electrode 2 and the glass substrate 1 and are emitted outwardly. On the other hand, light beams emerging from the light-emitting elements 4 towards the cathode 6 are reflected off the cathode 6, pass through the light-emitting elements 4 or the color filters 5, the transparent electrode 2, and the glass substrate 1, and then are emitted outwardly.

When the light-emitting elements 4 are originally designed to emit red light, the light actually emitted by the light-emitting elements 4 has a wavelength range centered on the wavelength corresponding to red light. That is, the light actually emitted from the light-emitting elements 4 is not pure red light, but includes wavelength components distorting the hue.

Since the color filters 5 have wavelength selectivity that selectively transmits only the wavelength of red light, the light emitted from the light-emitting elements 4 and transmitted through the color filters 5 includes only the wavelength components of red light. The light emitted outwardly to be provided for display includes the light passing through the color filters 5, and the light from the light-emitting elements 4 directly transmitted through the transparent electrode 2 and the glass substrate 1. The color purity of the light emitted outwardly to be provided for display is thus enhanced, in the organic EL display apparatus, by adopting the color filters 5 as light-transmitting members.

The present invention is not limited to the above-described exemplary embodiment, and modifications can be made, examples of which are described below:

(1) Although the comb-shaped auxiliary electrode 3 is used as illustrated in FIG. 1, the present invention is not limited to this exemplary embodiment. The auxiliary electrode 3 may be of other shapes provided that the three conditions described above are satisfied.

(2) Although the auxiliary electrode 3 is only provided on the light-emitting-layer side of the transparent electrode 2, the present invention is not limited to this exemplary embodiment. That is, the auxiliary electrode 3 may be provided on both surfaces of the light-emitting layer, or may be only provided on the surface adjacent to the glass substrate 1. However, to effectively supplement the conductivity of the transparent electrode 2 and simplify the production process, providing the auxiliary electrode 3 only on the light-emitting-layer side is most preferable.

(3) The auxiliary electrode 3 can be made into a thin film of several tens of nanometers since it is formed by, for example, evaporation on the surface of the transparent electrode 2. Although it is made of a metal, the thin-film auxiliary electrode 3 is transparent. Considering the balance of the three conditions described above, the area of the auxiliary electrode 3 can extend further than that shown in FIG. 1, since the constraint on the condition of sufficiently transmitting light emitted from the light-emitting elements 4 is released.

(4) Although the color filters 5 with wavelength selectivity are used as light-transmitting members in the above exemplary embodiment, light-transmitting members having no wavelength selectivity may also be used in the present invention.

(5) Although the above exemplary embodiment is concerned with the organic EL display apparatus, the present invention may also be applied to display apparatuses using light-transmitting material other than organic EL material.

(6) Although the above exemplary embodiment is concerned with the organic EL display apparatus where the light-emitting devices are two-dimensionally arranged on the glass substrate 1, the present invention is not limited to the two-dimensional arrangement. It may also be applied to display apparatuses where the light-emitting devices are one-dimensionally arranged.

(7) Although the above exemplary embodiment is concerned with the organic EL display apparatus for color display, the present invention may also be applied to display apparatuses for monochrome display.

[Advantages]

As described above, according to the present invention, the light-emitting elements are only disposed in the regions adjacent to the auxiliary electrode, and the light-transmitting members are disposed in the other regions. That is, since the light-emitting elements are partially replaced with the light-transmitting members, the use of the material for the light-emitting elements can be reduced.

What is claimed is:

1. A display apparatus, comprising:
  a plurality of light-emitting devices, each of the light-emitting devices including:
    a light-emitting unit, including:
      a cathode;
      a transparent anode serving as a pixel electrode;
      light-emitting elements interposed between the cathode and the anode;
      an auxiliary electrode; and
      light-transmitting members; and a driving circuit to feed a driving current to the anode;

the auxiliary electrode being disposed on at least one surface of the anode, and being branched off from a feeding point of the driving circuit, the light-emitting elements being only disposed in regions adjacent to the auxiliary electrode, and the light-transmitting members being disposed in other regions distant from the auxiliary electrode.

2. The display apparatus according to claim 1, the auxiliary electrode including a metal with a resistivity lower than a resistivity of the anode.

3. The display apparatus according to claim 1, the auxiliary electrode being disposed on the anode surface adjacent to the light-emitting elements.

4. The display apparatus according to claim 1, the light-transmitting members being wavelength-selective light-transmitting members to selectively transmit only the light originally designed to be emitted from the light-emitting elements.

5. The display apparatus according to claim 1, the light-emitting elements including an organic electroluminescent (EL) material.

6. The display apparatus according to claim 1, the plurality of light-emitting devices being two-dimensionally arranged.

7. The display apparatus according to claim 1, the display apparatus being capable of color display.

8. The display apparatus according to claim 1, the light-emitting elements and the light-transmitting members being formed by an inkjet process.

9. A method for displaying information, comprising:

arranging a plurality of light-emitting devices, each including a light-emitting unit including a cathode, a transparent anode serving as a pixel electrode, light-emitting elements interposed between the cathode and the anode, an auxiliary electrode, and light-transmitting members, and a driving circuit to feed a driving current to the anode, the auxiliary electrode being disposed on at least one surface of the anode, and being branched off from a feeding point of the driving circuit, the light-emitting elements being only disposed in regions adjacent to the auxiliary electrode, and the light-transmitting members being disposed in the other regions distant from the auxiliary electrode; and feeding the driving current from the driving circuit to the anode, thereby allowing the light-emitting elements to emit light to display information.

10. The method for displaying information according to claim 9, the auxiliary electrode including a metal with a resistivity lower than a resistivity of the anode.

11. The method for displaying information according to claim 9, further including disposing the auxiliary electrode on the anode surface adjacent to the light-emitting elements.

12. The method for displaying information according to claim 9, the light-transmitting members being wavelength-selective light-transmitting members to selectively transmit only the light originally designed to be emitted from the light-emitting elements.

13. The method for displaying information according to claim 9, the light-emitting elements including an organic EL material.

14. The method for displaying information according to claim 9, the plurality of light-emitting devices being two-dimensionally arranged.

15. The method for displaying information according to claim 9, further including displaying information in color.

* * * * *